United States Patent
Sun et al.

(10) Patent No.: US 8,111,023 B2
(45) Date of Patent: Feb. 7, 2012

(54) CONTROL SYSTEM FOR DIFFERENT COLORS OF LIGHT EMITTING DIODES

(75) Inventors: Tai-Ping Sun, Jhongli (TW);
    Chia-Hung Wang, Situn Dist. (TW);
    Tzu-Lun Hung, Dongshan Township,
    Yilan County (TW); Heng-Yu Yan,
    Jiaosi Township, Yilan County (TW)

(73) Assignee: National Chi Nan University, Nantou (TW)

( * ) Notice: Subject to any disclaimer, the term of this patent is extended or adjusted under 35 U.S.C. 154(b) by 369 days.

(21) Appl. No.: 12/338,334

(22) Filed: Dec. 18, 2008

(65) Prior Publication Data

US 2010/0156467 A1    Jun. 24, 2010

(51) Int. Cl.
    *H05B 37/02* (2006.01)
(52) U.S. Cl. ......... 315/360; 315/291; 315/307; 315/312
(58) Field of Classification Search .............. 315/209 R, 315/224–226, 291, 294, 297, 307–308, 312, 315/360; 345/61, 76, 82, 690
    See application file for complete search history.

(56) References Cited

U.S. PATENT DOCUMENTS

| 5,420,482 | A  | * | 5/1995 | Phares | 315/292 |
|-----------|----|---|--------|--------|---------|
| 6,016,038 | A  |   | 1/2000 | Mueller et al. | |
| 6,788,011 | B2 | * | 9/2004 | Mueller et al. | 315/294 |
| 7,397,195 | B2 | * | 7/2008 | Yu et al. | 315/194 |
| 7,728,798 | B2 | * | 6/2010 | Kim | 345/82 |
| 7,768,216 | B2 | * | 8/2010 | Pauritsch | 315/360 |
| 2009/0040243 | A1 | * | 2/2009 | Hisada et al. | 345/690 |
| 2009/0115347 | A1 | * | 5/2009 | Nakao et al. | 315/294 |
| 2009/0160367 | A1 | * | 6/2009 | Imanaka | 315/307 |
| 2009/0174338 | A1 | * | 7/2009 | Muramatsu | 315/250 |

* cited by examiner

*Primary Examiner* — Tung X Le
(74) *Attorney, Agent, or Firm* — Merchant & Gould P.C.

(57) ABSTRACT

A control system includes a clock unit for providing a first clock signal, and a second clock signal having a frequency lower than that of the first clock signal. Three control units are coupled respectively to three light emitting diodes (LED) emitting respectively three different colors. Each control unit is operable based on the clock signals and a corresponding set of first and second reference values to output a driving pulse signal to a corresponding LED such that the corresponding LED is driven by the driving pulse signal to emit light during a corresponding one of first, second and third time periods of a control cycle of the control system.

15 Claims, 7 Drawing Sheets

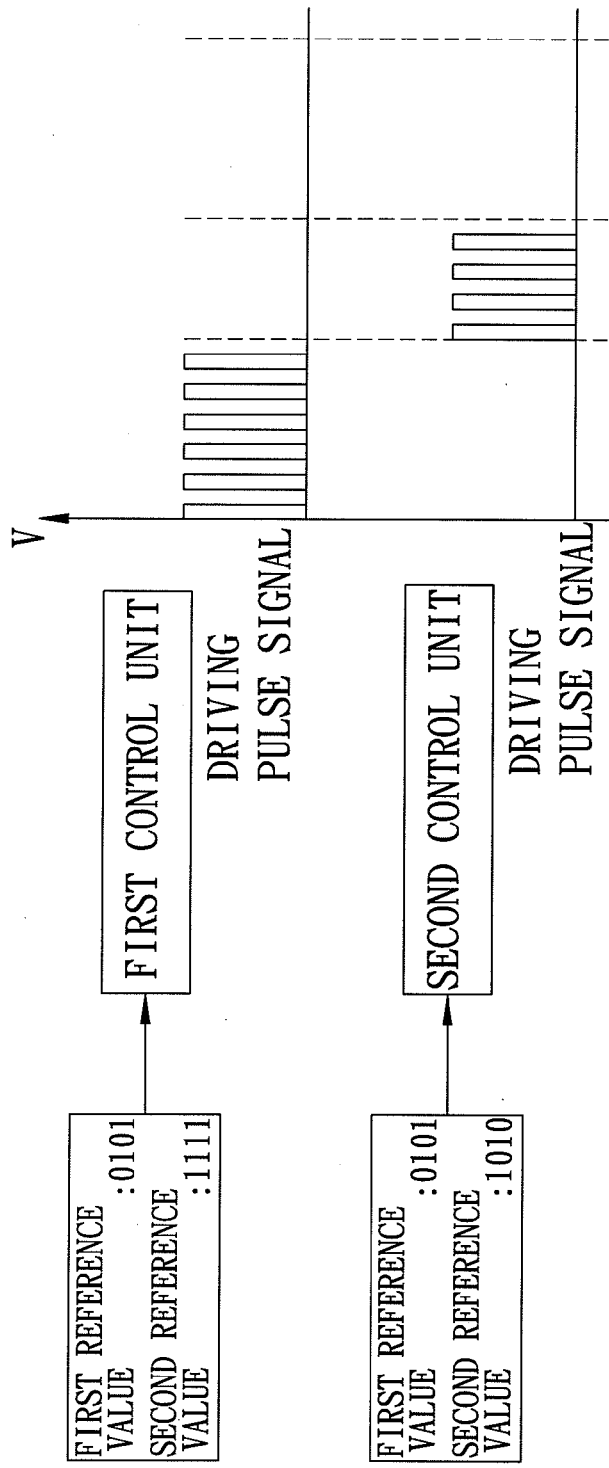

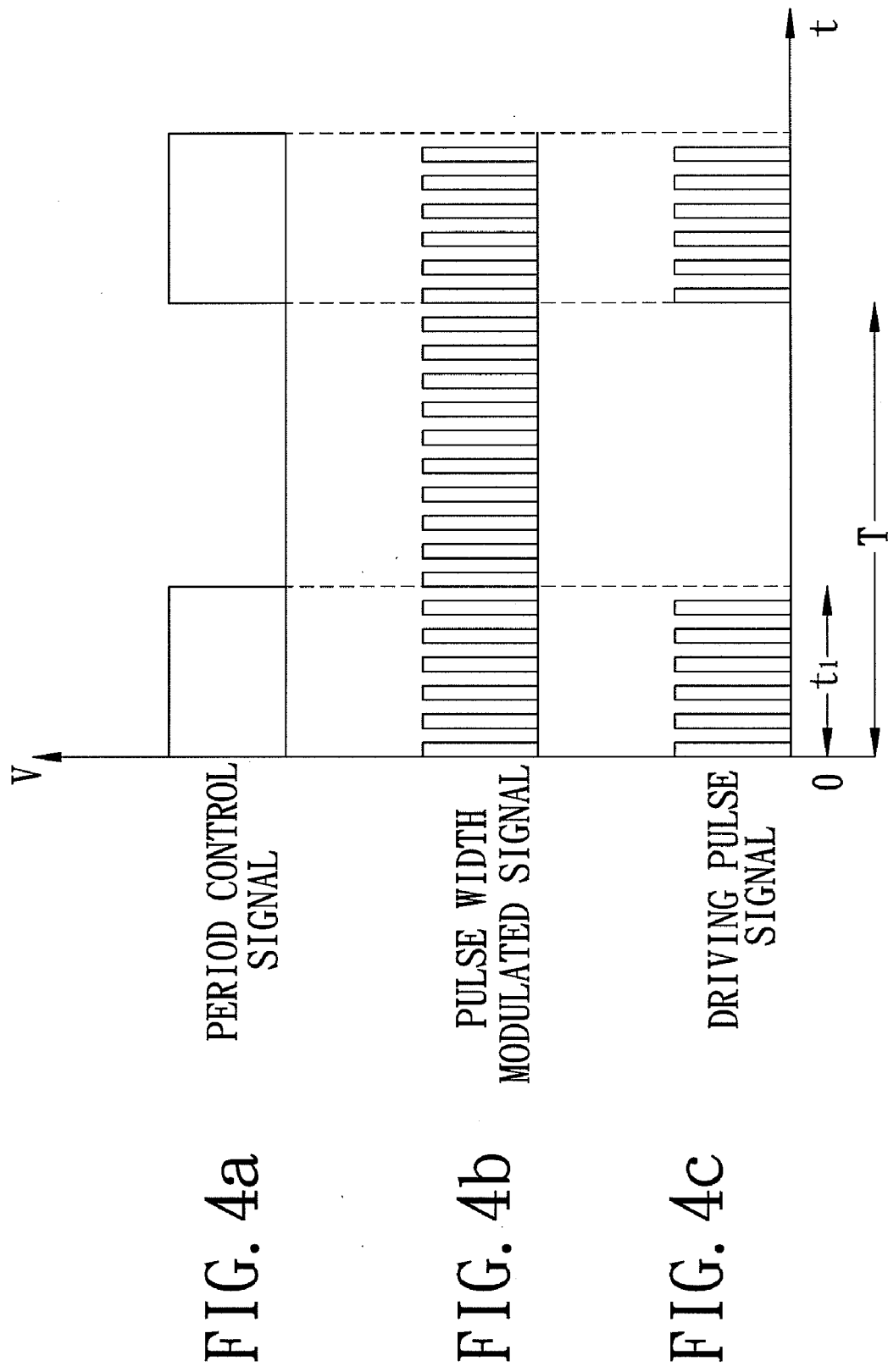

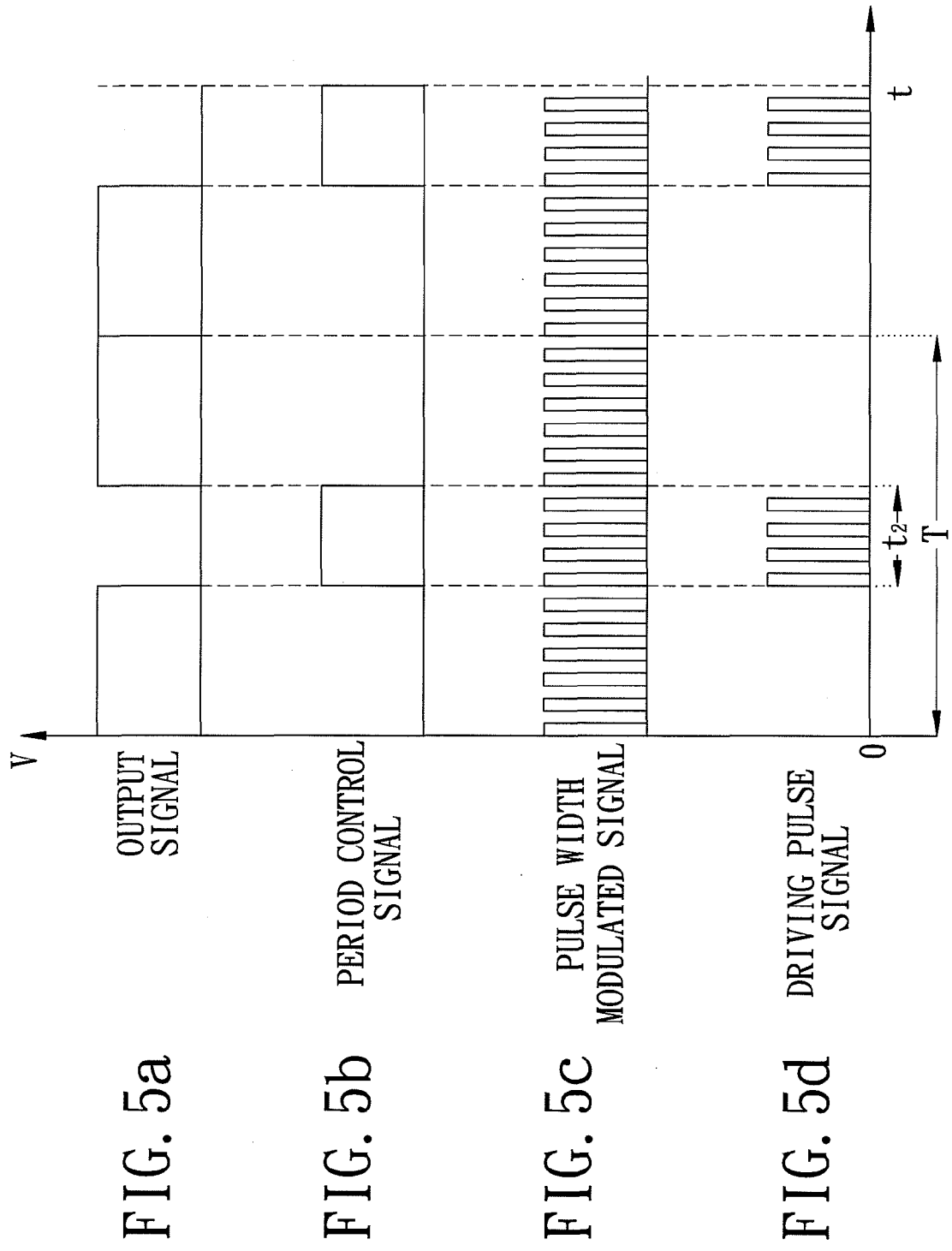

CONTROL SYSTEM FOR DIFFERENT COLORS OF LIGHT EMITTING DIODES

BACKGROUND OF THE INVENTION

1. Field of the Invention

The invention relates to a control system, more particularly to a control system for different colors of light emitting diodes.

2. Description of the Related Art

A conventional control system for three different colors of light emitting diodes disclosed in FIG. 9 of U.S. Pat. No. 6,016,038 achieves mixing of light emitted by the light emitting diodes by controlling duty cycles of the light emitting diodes during an exemplary period.

However, since the conventional control system controls the light emitting diodes to simultaneously emit light during each period, poor light-mixing is presented at a periphery of a combination of the light emitting diodes. Therefore, the conventional control system cannot ensure a uniform light-mixing effect.

SUMMARY OF THE INVENTION

Therefore, an object of the present invention is to provide a control system for different colors of light emitting diodes that can achieve a uniform light-mixing effect through vision persistence of human eyes and that can ensure stabilization of the consumed power of the light emitting diodes.

According to the present invention, there is provided a control system for three light emitting diodes emitting respectively three different colors. The control system comprises:

a clock unit for providing a first clock signal, and a second clock signal having a frequency lower than that of the first clock signal; and three control units coupled to the clock unit for receiving the first and second clock signals therefrom, and adapted to be coupled respectively to the light emitting diodes, each of the control units being operable based on the first and second clock signals from the clock unit, and a corresponding set of first and second reference values to output a driving pulse signal having a pulse width associated with the first clock signal to a corresponding one of the light emitting diodes during a corresponding one of first, second and third time periods that constitute a control cycle of the control system, the corresponding one of the first, second and third time periods being associated with the corresponding set of the first and second reference values such that the corresponding one of the light emitting diodes is driven by the driving pulse signal to emit light during the corresponding one of the first, second and third time periods of the control cycle.

BRIEF DESCRIPTION OF THE DRAWINGS

Other features and advantages of the present invention will become apparent in the following detailed description of the preferred embodiments with reference to the accompanying drawings, of which:

FIGS. 3a to 3c illustrate waveforms of driving pulse signals outputted by the first, second and third control units based on three sets of first and second reference values, respectively;

FIG. 4a to 4c illustrate waveforms of a period control signal, a pulse width modulated signal and the driving pulse signal outputted by a period control unit, a pulse width modulator and a driving unit of the first control unit, respectively;

FIG. 5a to 5d illustrate waveforms of an output signal, a period control signal, a pulse width modulated signal and the driving pulse signal outputted by a flip-flop of a period control unit, an inverter of the period control unit, a pulse width modulator and a driving unit of the second control unit, respectively.

DETAILED DESCRIPTION OF THE PREFERRED EMBODIMENTS

Figure 1:
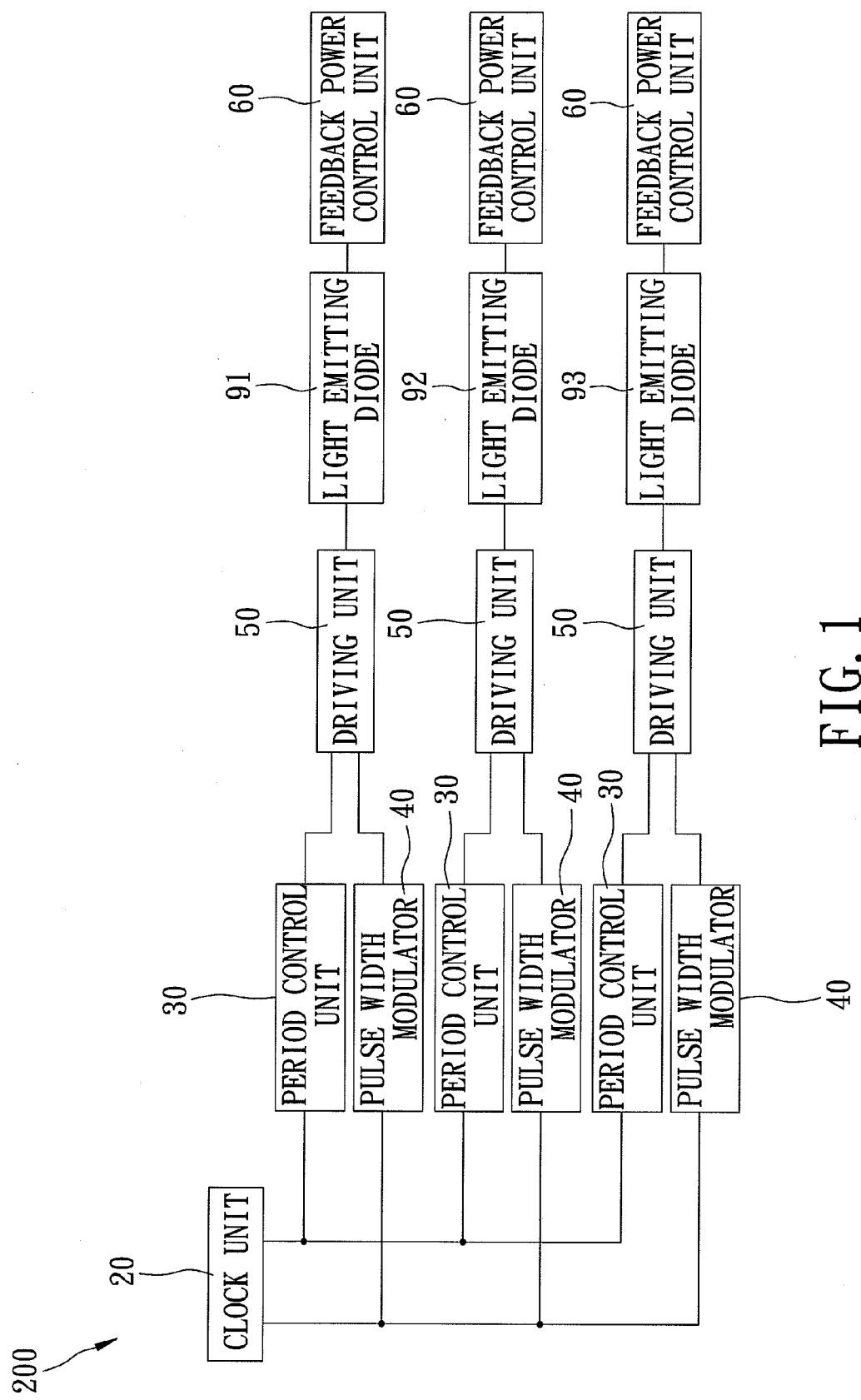
FIG. 1 is a schematic circuit block diagram illustrating the first preferred embodiment of a control system for three light emitting diodes according to the present invention.

Before the present invention is described in greater detail, it should be noted that like elements are denoted by the same reference numerals throughout the disclosure.

Figure 2:
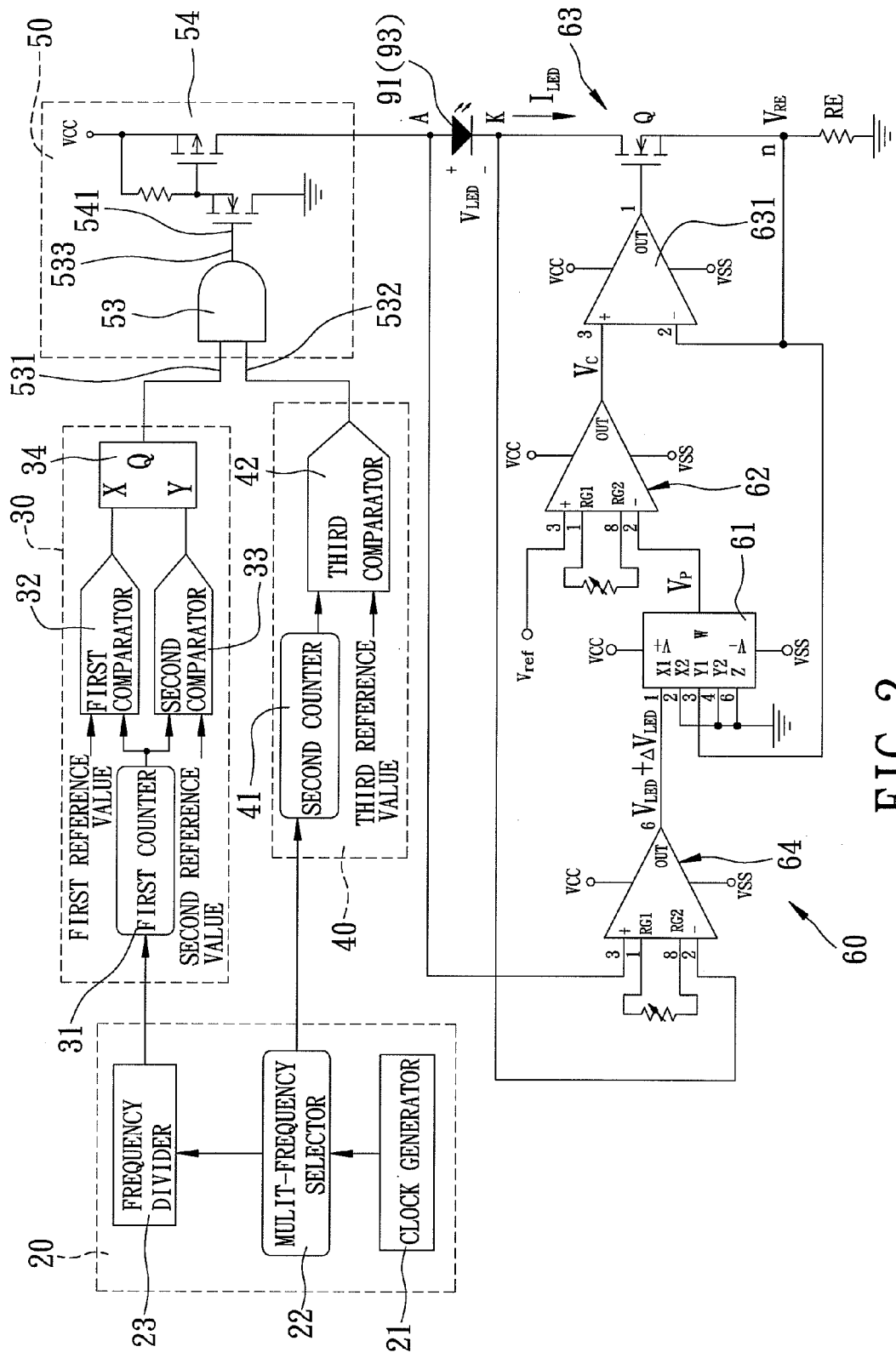
FIG. 2 is a schematic electrical circuit block diagram illustrating a clock unit and a first/third control unit of the first preferred embodiment.
Figure 2A:
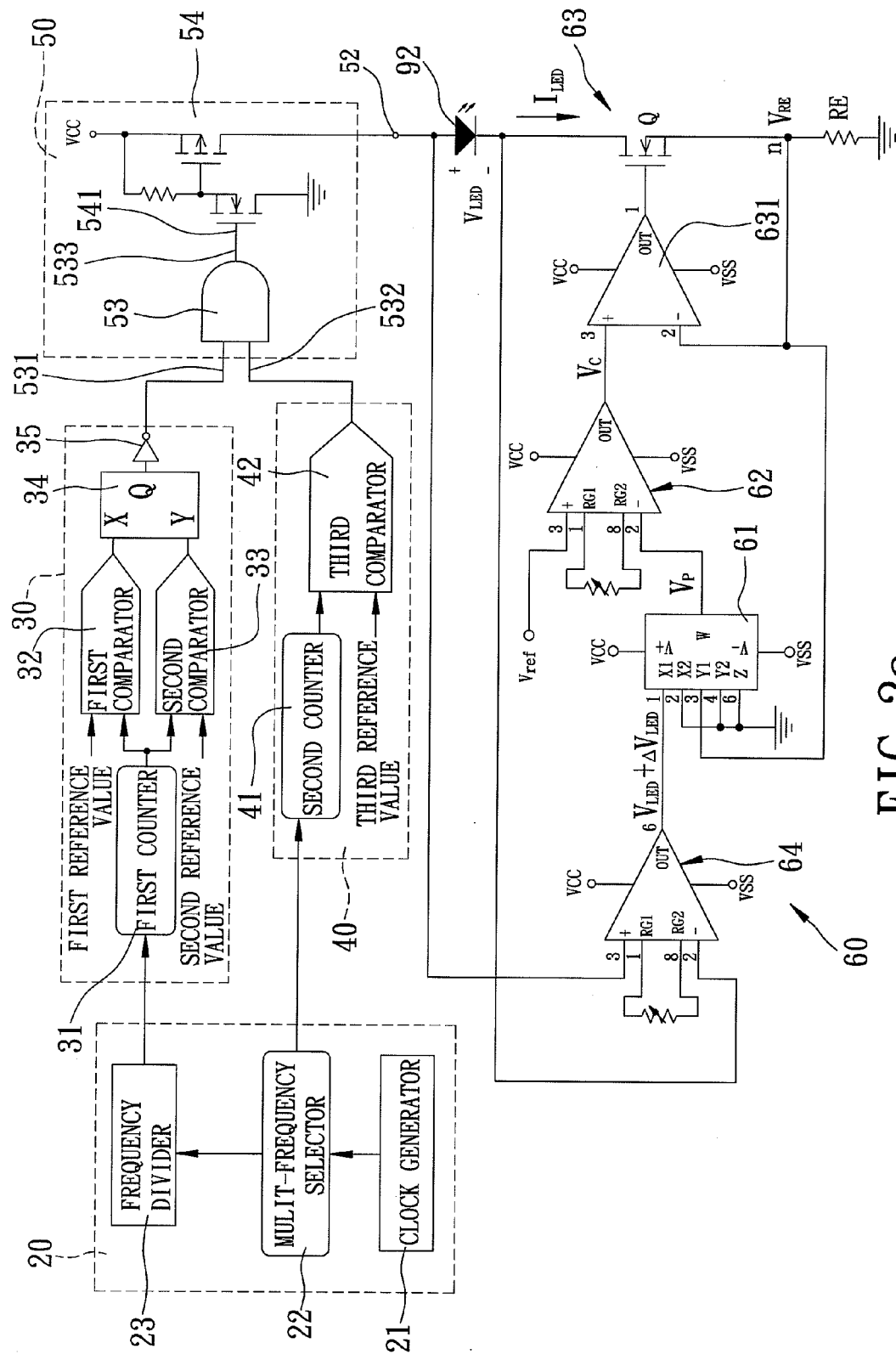
FIG. 2a is a schematic electrical circuit block diagram illustrating the clock unit and a second control unit of the first preferred embodiment.

Referring to FIGS. 1, 2 and 2a, the preferred embodiment of a control system 200 for three light emitting diodes 91, 92, 93 emitting respectively red, green and blue light according to the present invention is shown to include a clock unit 20, and first, second and third control units.

The clock unit 20 provides a first clock signal, and a second clock signal having a frequency lower than that of the first clock signal. In this embodiment, as shown in FIG. 2, the clock unit 20 includes a clock generator 21, a multi-frequency selector 22 and a frequency divider 23. The clock generator 21 generates a clock signal. The multi-frequency selector 22 is coupled to the clock generator 21, receives the clock signal from the clock generator 21, and outputs the first clock signal to each of the first, second and third control units based on the clock signal. The frequency divider 23 is coupled to the multi-frequency selector 22 for dividing the first clock signal from the multi-frequency selector 22 to obtain the second clock signal and for outputting the second clock signal to each of the first, second and third control units.

The first, second and third control units are coupled to the clock unit 20 for receiving the first and second clock signals therefrom, and are adapted to be coupled respectively to the light emitting diodes 91, 92, 93. Each of the first, second and third control units is operable based on the first and second clock signals from the clock unit 20, and a corresponding set of first and second reference values to output a driving pulse signal having a pulse width associated with the first clock signal to a corresponding one of the light emitting diodes 91, 92, 93 during a corresponding one of first, second and third time periods (t1, t2, t3) that constitute a control cycle (T) of the control system 200. As shown in FIG. 3, the corresponding one of the first, second and third time periods (t1, t2, t3) is associated with the corresponding set of the first and second reference values such that the corresponding one of the light emitting diodes 91, 92, 93 is driven by the driving pulse signal to emit light during the corresponding one of the first, second and third time periods (t1, t2, t3) of the control cycle (T).

In this embodiment, each of the first, second and third control units includes a period control unit 30, a pulse width modulator 40, a driving unit 50, and a feedback power control unit 60.

The period control unit 30 of each of the first, second and third control units generates a period control signal based on the second clock signal from the clock unit 20, and the corresponding set of the first and second reference values. In this embodiment, for each of the first, second and third control units, the period control unit 30 includes a first counter 31, a first comparator 32, a second comparator 33 and a flip-flop 34. The first counter 31 is coupled to the frequency divider 23 of the clock unit 20 for outputting a first count value based on the second clock signal from the frequency divider 23 of the clock unit 20. The first comparator 32 is coupled to the first counter 31 for receiving the first count value therefrom, compares the first count value with the first reference value for the corresponding one of the first, second and third control units, and outputs a first comparison signal based on result of the comparison made thereby, wherein the first comparison signal has a high logic level when the first reference value for the corresponding one of the first, second and third control units is not less than the first count value, and has a low logic level when otherwise. The second comparator 33 is coupled to the first counter 31 for receiving the first count value therefrom, compares the first count value with the second reference value for the corresponding one of the first, second and third control units, and outputs a second comparison signal based on result of the comparison made thereby, wherein the second comparison signal has a high logic level when the second reference value for the corresponding one of the first, second and third control units is not greater than the first count value, and has a low logic level when otherwise. The flip-flop 34 is coupled to the first and second comparators 32, 33 for receiving the first and second comparison signals therefrom, and outputs an output signal, wherein the output signal has a high logic level when one of the first and second comparison signals has a high logic level and the other one of the first and second comparison signals has a low logic level, has a low logic level when each of the first and second comparison signals has a low logic level, and retains a current logic level when each of the first and second comparison signals has a high logic level. It is noted that, as shown in FIG. 2a, the period control unit 30 of the second control unit for the light emitting diode 92 further includes an inverter 35, such as a NOT gate, coupled to the flip-flop 34 for inverting the output signal outputted by the flip-flop 34. Therefore, the output signal inverted by the inverter 35 serves as the period control signal of the second control unit, while the output signal of the flip-flop 34 serves as the period control signal of the first and third control units.

The pulse width modulator 40 of each of the first, second and third control units is coupled to the multi-frequency selector 22 of the clock unit 20 for receiving the first clock signal therefrom, and outputs a pulse width modulated signal based on the first clock signal from the multi-frequency selector 22 of the clock unit 20. In this embodiment, for each of the first, second and third control units, the pulse width modulator 40 includes a second counter 41 and a third comparator 42. The second counter 41 is coupled to the multi-frequency selector 22 of the clock unit 20 for outputting a second count value based on the first clock signal from the multi-frequency selector 22 of the clock unit 20. The third comparator 42 is coupled to the second counter 41 for receiving the second count value therefrom, compares the second count value with a third reference value, and out puts the pulse width modulated signal based on result of the comparison made thereby, wherein the pulse width modulated signal has a high logic level when the third reference value for the corresponding one of the first, second and third control units is not greater than the second count value, and has a low logic level when otherwise. It is noted that the pulse width of the driving pulse signal outputted by each of the first, second and third control units is decided based on the third reference value for the corresponding one of the first, second and third control units.

For each of the first, second and third control units, the driving unit 50 is coupled to the period control unit 30 and the pulse width modulator 40 for receiving the period control signal and the pulse width modulated signal therefrom, is adapted to be coupled to the corresponding one of the light emitting diodes 91, 92, 93, and outputs the driving pulse signal based on the period control signal and the pulse width modulated signal. In this embodiment, for each of the first, second and third control units, the driving unit 50 includes a logic gate 53 and a switch circuit 54. The logic gate 53, such as an AND gate, has first and second inputs 531, 532 coupled respectively to the period control unit 30 and the pulse width modulator 40 for receiving the period control signal and the pulse width modulated signal therefrom, and outputs a control signal at an output 533 thereof based on the period control signal and the pulse width modulated signal. The switch circuit 54 is adapted to be coupled in series with a power source (VCC) and the corresponding one of the light emitting diodes 91, 92, 93, and has a control input 541 coupled to the output 533 of the logic gate 53 for receiving the control signal therefrom. The switch circuit 54 is operable so as to control supply of an electric power from the power source (VCC) to the corresponding one of the light emitting diodes 91, 92, 93 based on the control signal from the logic gate 53, thereby producing the driving pulse signal to the corresponding one of the light emitting diodes 91, 92, 93. In this embodiment, the switch circuit 54 includes a resistor, a PMOS field effect transistor and an NMOS field effect transistor.

In this embodiment, the first counter 31 of the period control unit 30 and the second counter 41 of the pulse width modulator 40 of each of the first, second and third control units are a 4-bit counter, and the first and second reference values for the corresponding one of the first, second and third control units are in the form of a 4-bit binary value. For example, if the three sets of the first and second reference values for the first, second and third control units are (0101, 1111) (0101, 1010), and (0000, 1010), respectively, waveforms of the driving pulse signals outputted by the first, second and third control units are shown in FIGS. 3a to 3c, respectively. That is, the light emitting diode 91 is driven by the driving pulse signal outputted by the first control unit to emit red light during the first time period (t1) of the control cycle (T); the light emitting diode 92 is driven by the driving pulse signal outputted by the second control unit to emit green light during the second time period (t2) of the control cycle (T); and the light emitting diode 93 is driven by the driving pulse signal outputted by the third control unit to emit blue light during the third time period (t3) of the control cycle (T). Detailed operations of the first control unit are shown in FIGS. 4a to 4c, wherein FIG. 4a illustrates a waveform of the period control signal outputted by the period control unit 30, FIG. 4b illustrates a waveform of the pulse width modulated signal outputted by the pulse width modulator 40, and FIG. 4c illustrates a waveform of the driving pulse signal outputted by the driving unit 50. Detailed operations of the second control unit are shown in FIG. 5a to 5d, wherein FIG. 5a illustrates a waveform of the output signal outputted by the flip-flop 34 of the period control unit 30, FIG. 5b illustrates a waveform of the output signal inverted by the inverter 35 of the period control unit 30, i.e., the period control signal outputted by the period control unit 30, FIG. 5c illustrates a waveform of the pulse width modulated signal outputted by the pulse width modulator 40, and FIG. 5d illustrates a waveform of the driving pulse signal outputted by the driving unit 50.

The feedback power control unit 60 of each of the first, second and third control units is coupled to the corresponding one of the light emitting diodes 91, 92, 93. Each of the light emitting diodes 91, 92, 93 driven by the corresponding one of the first, second and third control units has a work current ($I_{LED}$) flowing therethrough. In this embodiment, as shown in FIGS. 2 and 2a, the feedback power control unit 60 of each of the first, second and third control units includes an amplifying module 64, a multiplication module 61, a control module 62, and a regulating module 63.

For the feedback power control unit 60 of each of the first, second and third control units, the amplifying module 64 has an input unit adapted to be coupled to the anode and cathode (A, K) of the corresponding one of the light emitting diodes 91, 92, 93 for outputting a work voltage corresponding to a voltage drop across the corresponding one of the light emitting diodes 91, 92, 93 at an output thereof. A value of the work voltage can be expressed as $V_{LED}+\Delta V_{LED}$, where $\Delta V_{LED}$ indicates a voltage variation of the work voltage in response to temperature variation of the corresponding one of the light emitting diodes 91, 92, 93.

The multiplication module 61 has an input unit that includes a first input terminal (X1) coupled to the output of the amplifying module 64 for receiving the work voltage therefrom, and a second input terminal (Y1) for receiving a feedback voltage ($V_{RE}$) corresponding to the work current ($I_{LED}$) flowing through the corresponding one of the light emitting diodes 91, 92, 93, and an output terminal (W) for outputting a measuring voltage ($V_P$) corresponding to a consumed power of the corresponding one of the light emitting diodes 91, 92, 93. A value of the measuring voltage ($V_P$) corresponds to a product of the value ($V_{LED}+\Delta V_{LED}$) of the work voltage and a value of the feedback voltage ($V_{RE}$). In other words, the measuring voltage ($V_P$) can be expressed as follows:

$$V_P=(V_{LED}+\Delta V_{LED})\times V_{RE}$$

The control module 62 has a first input end coupled to the output terminal (W) of the multiplication module 61 for receiving the measuring voltage ($V_P$) therefrom, a second input end adapted for receiving a reference voltage ($V_{REF}$), and an output end for outputting a control voltage ($V_C$) corresponding to a voltage difference between the measuring voltage ($V_P$) and the reference voltage ($V_{REF}$). Thus, the control voltage ($V_C$) can be expressed as follows:

$$V_C=G\times(V_{REF}-V_P)$$

where G is a gain of the control module 62.

The regulating module 63 provides the feedback voltage ($V_{RE}$) to the second input terminal (Y1) of the input unit of the multiplication module 61, and includes an amplifier 631, and a series connection of a transistor (Q) and a resistor ($R_E$) adapted to be coupled to the cathode (K) of the corresponding one of the light emitting diodes 91, 92, 93 and providing the feedback voltage ($V_{RE}$). The transistor (Q) is an NMOS field effect transistor in this embodiment, is adapted to be coupled between the cathode (K) of the corresponding one of the light emitting diodes 91, 92, 93 and the resistor (RE). The resistor (RE) is coupled between the transistor (Q) and ground. A common node (n) between the transistor (Q) and the resistor (RE) is coupled to the second input terminal (Y1) of the input unit of the multiplication module 61. In this embodiment, a potential at the common node (n) serves as the feedback voltage ($V_{RE}$). The amplifier 631 has a first input end coupled to the common node (n) for receiving the feedback voltage ($V_{RE}$) therefrom, a second input end coupled to the output end of the control module 62 for receiving the control voltage ($V_C$) therefrom, and an output end coupled to a gate of the transistor (Q) for controlling operation of the transistor (Q).

It is noted that the work current ($I_{LED}$) of each of the light emitting diodes 91, 92, 93 is closely related to the resistor (RE) of the regulating module 63 of the feedback power control unit 60 of the corresponding one of the first, second and third control units, and has insignificant relation to the transistor (Q) of the regulating module 63 of the feedback power control unit 60 of the corresponding one of the first, second and third control units. Therefore, stabilization of the consumed power of each of the light emitting diodes 91, 92, 93 can be attained by selecting appropriately the reference voltage ($V_{REF}$) and the resistance of the resistor ($R_E$). In actual use, if the work voltage of each of the light emitting diodes 91, 92, 93 is reduced as a result of an increase in the temperature thereof, the measuring voltage ($V_P$) outputted by the multiplication module 61 of the feedback power control unit 60 of the corresponding one of the first, second and third control units is reduced, and the control voltage ($V_C$) outputted by the control unit 50 is increased, thereby resulting in a corresponding increase in the work current ($I_{LED}$). Therefore, the increased work current ($I_{LED}$) and the decreased work voltage can stabilize the consumed power of each of the light emitting diodes 91, 92, 93.

In sum, since each of the light emitting diodes 91, 92, 93 is driven by the corresponding one of the control units to emit light during the corresponding one of the first, second and third time periods of the control cycle, during each control cycle of the control system 200, mixing of light emitted by the light emitting diodes 91, 92, 93 through vision persistence of human eyes is uniform without the drawback of poor light-mixing at a periphery of a combination of the light emitting diodes 91, 92, 93 as encountered in the aforesaid conventional control system. Therefore, the control system 200 of the present invention can achieve a uniform light-mixing effect. Furthermore, due to the presence of the feedback power control units 60, the control system 200 can ensure stabilization of the consumed power of the light emitting diodes 91, 92, 93.

Figure 6:
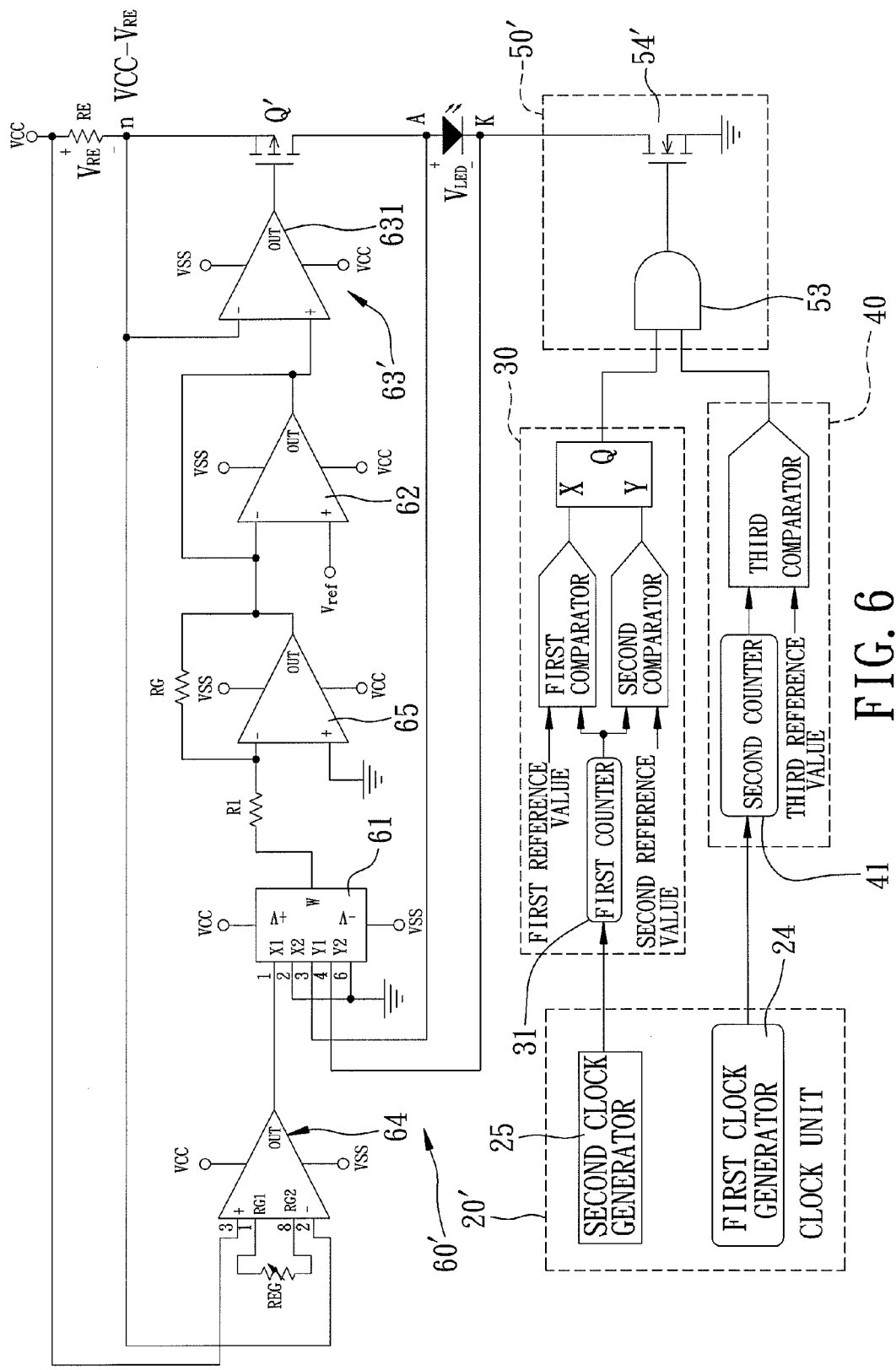
FIG. 6 is a schematic electrical circuit block diagram illustrating a clock unit and a first/third control unit of the second preferred embodiment of a control system for three light emitting diodes according to the present invention.

FIG. 6 illustrates the second preferred embodiment of a control system for three light emitting diodes emitting respectively three different colors according to this invention, which is a modification of the first preferred embodiment, wherein only one control unit for a corresponding light emitting diode is shown.

In this embodiment, the clock unit 20' includes a first clock generator 24 coupled to the second counter 41 of the pulse width modulator 40 of each control unit for outputting the first clock signal thereto, and a second clock generator 25 coupled to the first counter 31 of the period control unit 30 of each control unit for outputting the second clock signal thereto.

The switch circuit 54' of the driving unit 50' of each control unit includes an NMOS field effect transistor.

For the feedback power control unit 60' of each control unit, the input unit of the amplifying module 64 is coupled to opposite terminals of the resistor (RE) of the regulating module 63' for receiving the feedback voltage at the common node (n) so as to output a voltage drop ($V_{RE}$) across the resistor (RE) of the regulating module 63' at the output thereof. The first input terminal (X1) of the input unit of the multiplication module 61 receives the feedback voltage ($V_{RE}$) from the amplifying module 64. The second input terminal (Y1) and a third input terminal (Y2) of the input unit of the multiplication module 61 are coupled respectively to the anode (A) and the cathode (K) of the corresponding light emitting diode for obtaining the work voltage corresponding to a voltage drop across the corresponding light emitting diode. An additional amplifying module 65 is coupled between the output terminal (W) of the multiplication module 61 and the first input end of the control module 62. The transistor (Q') of the regulating module 63' is a PMOS field effect transistor in this embodiment. It is noted that, in this embodiment, a potential (VCC-$V_{RE}$) at the common node (n) serves as the feedback voltage.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A control system for three light emitting diodes emitting respectively three different colors, said control system comprising:
    a clock unit for providing a first clock signal, and a second clock signal having a frequency lower than that of the first clock signal; and
    three control units coupled to said clock unit, and adapted to be coupled respectively to the light emitting diodes, each of said control units receiving the first and second clock signals from said clock unit and being operable based on the first and second clock signals received thereby, and a corresponding set of first and second reference values to output a driving pulse signal having a pulse width associated with the first clock signal to a corresponding one of the light emitting diodes during a corresponding one of first, second and third time periods that constitute a control cycle of said control system, the corresponding one of the first, second and third time periods being associated with the corresponding set of the first and second reference values such that the corresponding one of the light emitting diodes is driven by the driving pulse signal to emit light during the corresponding one of the first, second and third time periods of the control cycle.

2. The control system as claimed in claim 1, wherein each of said control units includes:
    a period control unit for generating a period control signal based on the second clock signal from said clock unit, and the corresponding set of the first and second reference values, said period control unit including
    a first counter coupled to said clock unit for outputting a first count value based on the second clock signal from said clock unit,
    a first comparator coupled to said first counter for receiving the first count value therefrom, comparing the first count value with the first reference value for the corresponding one of said control units, and outputting a first comparison signal based on result of the comparison made thereby,
    a second comparator coupled to said first counter for receiving the first count value therefrom, comparing the first count value with the second reference value for the corresponding one of said control units, and outputting a second comparison signal based on result of the comparison made thereby, and
    a flip-flop coupled to said first and second comparators for receiving the first and second comparison signals therefrom, and outputting an output signal, wherein the output signal has a high logic level when one of the first and second comparison signals has a high logic level and the other one of the first and second comparison signals has a low logic level, has a low logic level when each of the first and second comparison signals has a low logic level, and retains a current logic level thereof when each of the first and second comparison signals has a high logic level;
    a pulse width modulator coupled to said clock unit for receiving the first clock signal therefrom, and outputting a pulse width modulated signal based on the first clock signal from said clock unit; and
    a driving unit coupled to said period control unit and said pulse width modulator for receiving the period control signal and the pulse width modulated signal therefrom, adapted to be coupled to the corresponding one of the light emitting diodes, and outputting the driving pulse signal based on the period control signal and the pulse width modulated signal;
    wherein said period control unit of one of said control units further includes an inverter interconnecting electrically said flip-flop and said driving unit of said one of said control units for inverting the output signal outputted by said flip-flop, the output signal inverted by said inverter serving as the period control signal of said one of said control units, the output signal of said flip-flop serving as the period control signal of the other two of said control units.

3. The control system as claimed in claim 2, wherein:
    the first comparison signal outputted by said first comparator of said period control unit of each of said control units has a high logic level when the first reference value for the corresponding one of said control units is not less than the first count value outputted by said first counter of said period control unit of the corresponding one of said control units, and has a low logic level when otherwise; and
    the second comparison signal outputted by said second comparator of said period control unit of each of said control units has a high logic level when the second reference value for the corresponding one of said control units is not greater than the first count value outputted by said first counter of said period control unit of the corresponding one of said control units, and has a low logic level when otherwise.

4. The control system as claimed in claim 2, wherein said pulse width modulator of each of said control units includes:
    a second counter coupled to said clock unit for outputting a second count value based on the first clock signal from said clock unit; and
    a third comparator coupled to said second counter for receiving the second count value therefrom, comparing the second count value with a third reference value, and outputting the pulse width modulated signal based on result of the comparison made thereby;
    wherein the pulse width of the driving pulse signal outputted by said driving unit of the corresponding one of said control units is decided based on the third reference value for the corresponding one of the corresponding one of said control units.

5. The control system as claimed in claim 4, wherein the pulse width modulated signal outputted by said third comparator of said pulse width modulator of each of said control units has a high logic level when the third reference value for the corresponding one of said control units is not greater than the second count value outputted by said second counter of said pulse width modulator of the corresponding one of said control units, and has a low logic level when otherwise.

6. The control system as claimed in claim 2, wherein said clock unit includes:
    a clock generator for generating a clock signal;

a multi-frequency selector coupled to said clock generator and said pulse width modulator of each of said control units, receiving the clock signal from said clock generator, and outputting the first clock signal to said pulse width modulator of each of said control units based on the clock signal; and a frequency divider coupled to said multi-frequency selector and said first counter of said period control unit of each of said control units for dividing the first clock signal from said multi-frequency selector to obtain the second clock signal and for outputting the second clock signal to said period control unit of each of said control units.

7. The control system as claimed in claim 2, wherein said clock unit includes a first clock generator coupled to said pulse width modulator of each of said control units for outputting the first clock signal thereto, and a second clock generator coupled to said first counter of said period control unit of each of said control units for outputting the second clock signal thereto.

8. The control system as claimed in claim 2, wherein said inverter includes a NOT gate.

9. The control system as claimed in claim 2, wherein said driving unit of each of said control units includes:
   a logic gate having first and second inputs coupled respectively to said period control unit and said pulse width modulator of the corresponding one of said control units for receiving the period control signal and the pulse width modulated signal therefrom, and outputting a control signal at an output thereof based on the period control signal and the pulse width modulated signal; and
   a switch circuit adapted to be coupled in series with a power source and the corresponding one of the light emitting diodes, and having a control input coupled to said output of said logic gate for receiving the control signal therefrom, said switch circuit being operable so as to control supply of an electric power from the power source to the corresponding one of the light emitting diodes based on the control signal from said logic gate, thereby producing the driving pulse signal to the corresponding one of the light emitting diodes.

10. The control system as claimed in claim 9, wherein said logic gate is an AND gate.

11. The control system as claimed in claim 9, wherein said switch circuit includes at least one transistor.

12. The control system as claimed in claim 1, wherein each of said control units includes a feedback power control unit for the corresponding one of the light emitting diodes that has a work current flowing therethrough, said feedback power control unit including:
   a multiplication module having an input unit for receiving a work voltage corresponding to a voltage drop across the corresponding one of the light emitting diodes, and a feedback voltage corresponding to the work current flowing through the corresponding one of the light emitting diodes, and an output terminal for outputting a measuring voltage corresponding to a consumed power of the corresponding one of the light emitting diodes, a value of the measuring voltage corresponding to a product of a value of the work voltage and a value of the feedback voltage;
   a control module having a first input end coupled to said output terminal of said multiplication module for receiving the measuring voltage therefrom, a second input end adapted for receiving a reference voltage, and an output end for outputting a control voltage corresponding to a voltage difference between the measuring voltage and the reference voltage; and
   a regulating module providing the feedback voltage to said input unit of said multiplication module, and including
   a series connection of a transistor and a resistor adapted to be coupled to the corresponding one of the light emitting diodes and providing the feedback voltage, and
   an amplifier having a first input end for receiving the feedback voltage from the series connection of said transistor and said resistor, a second input end coupled to said output end of said control module for receiving the control voltage therefrom, and an output end coupled to said transistor for controlling operation of said transistor.

13. The control system as claimed in claim 12, wherein said transistor of said regulating module is adapted to be coupled between the corresponding one of the light emitting diodes and said resistor, a common node between said transistor and said resistor of said regulating module being coupled to said first input end of said amplifier of said regulating module, a potential at said common node serving as the feedback voltage.

14. The control system as claimed in claim 12, wherein said transistor of said regulating module is a field effect transistor having a gate coupled to said output end of said amplifier of said regulating module.

15. The control system as claimed in claim 1, wherein each of said control units includes:
   a period control unit coupled to said clock unit, receiving the second clock signal from said clock unit, and outputting a period control signal based on the second clock signal received thereby and the corresponding set of the first and second reference values;
   a pulse width modulator coupled to said clock unit, receiving the first clock signal from said clock unit, and outputting a pulse width modulated signal based on the first clock signal received thereby; and
   a driving unit coupled to said period control unit and said pulse width modulator and adapted to be coupled to the corresponding one of the light emitting diodes, said driving unit receiving the period control signal and the pulse width modulated signal from said period control unit and said pulse width modulator, and outputting the driving pulse signal based on the period control signal and the pulse width modulated signal.

* * * * *